March 2, 1965 J. B. SCHULTZ 3,172,040
AM/FM RECEIVER HAVING AUTOMATIC GAIN CONTROL
Filed Oct. 18, 1961
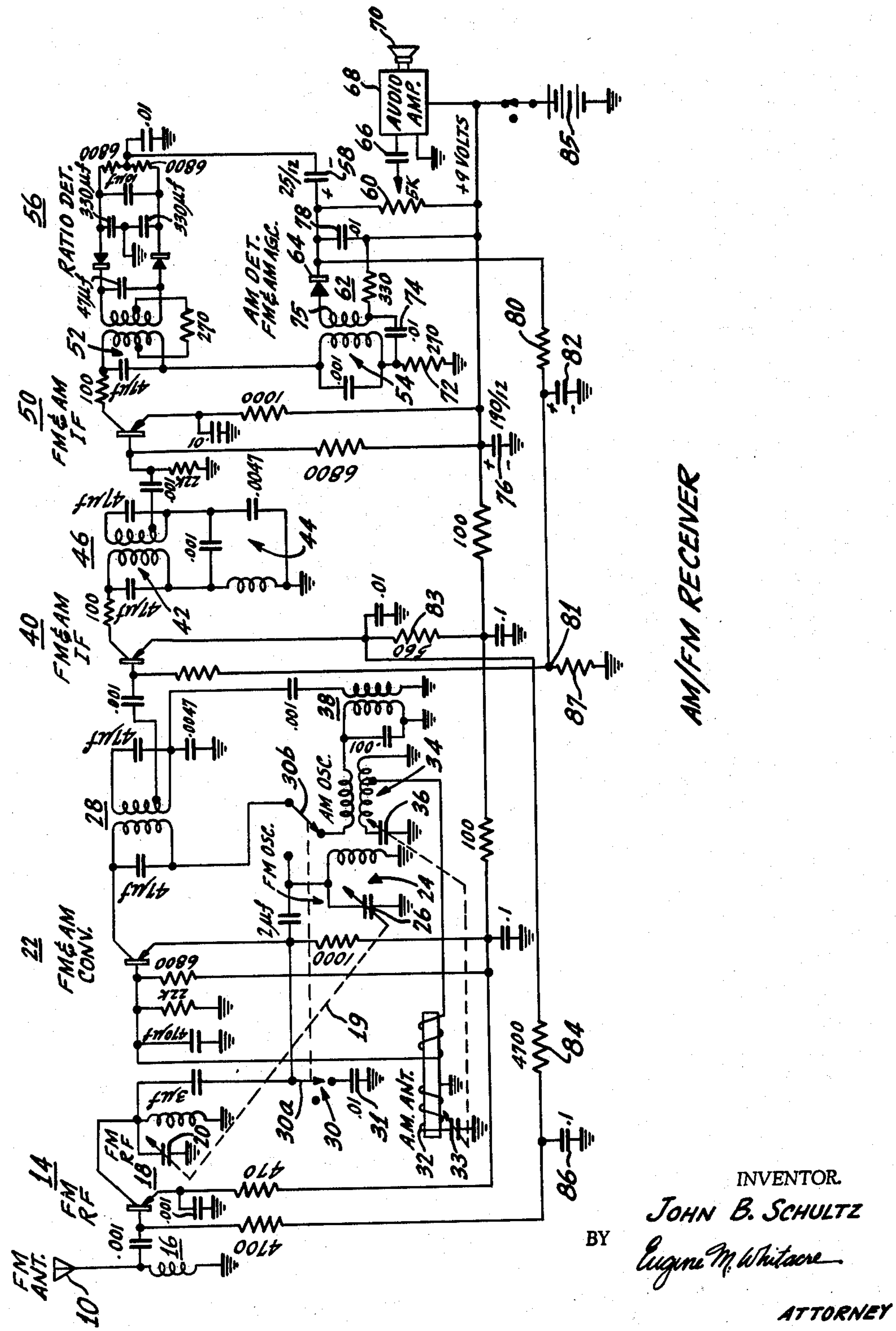
AM/FM RECEIVER
INVENTOR.
JOHN B. SCHULTZ
BY Eugene M. Whitacre
ATTORNEY United States Patent Office 3,172,040
Patented Mar. 2, 1965

3,172,040
AM/FM RECEIVER HAVING AUTOMATIC GAIN CONTROL

John B. Schultz, Haddonfield, N.J., assignor to Radio Corporation of America, a corporation of Delaware
Filed Oct. 18, 1961, Ser. No. 145,833
10 Claims. (Cl. 325—316)

This invention relates to signal receivers, and more particularly to transistor radio receivers for receiving amplitude modulation (AM) or frequency modulation (FM) transmissions.

In quality AM/FM receivers using transistors as active circuit devices, it is the usual practice to provide a radio-frequency (R-F) amplifier for received FM signals, whereas the first stage for received AM signals is usually a frequency converter or mixer stage. The purpose of the R-F amplifier stage for FM signals is to prevent local oscillator signal radiation which is troublesome at the FM oscillator frequencies, and to provide significantly improved signal-to-noise ratio for the reception of FM signals since for FM reception the limiting factor as to noise is the noise of the first amplifier stage, whereas because of man made and atmospheric noise in the AM frequency band the small improvement in signal-to-noise ratio effected by the use of an R-F amplifier is usually not warranted in view of the additional expense involved.

The output signal from the FM R-F oscillator is fed to a frequency converter which may be the same stage which is used as an AM frequency converter. Since economy of construction is always a factor in home type radio receivers, it is preferable that the frequency converter employ a single transistor which serves both as a heterodyne oscillation generator and as a signal mixer. Unless the output signal amplitude from the FM R-F amplifier is controlled, strong signals will tend to cause the oscillator portion of the transistor frequency converter to pull toward the frequency of the applied signal thereby degrading the operation of the receiver. This problem may be substantially obviated by limiting the strength of the signal that is applied to the frequency converter. Conventionally, this is accomplished by applying an automatic gain control (AGC) voltage to the FM R-F amplifier to control the gain thereof, or by using suitable overload diodes as series or shunt impedances in the FM R-F amplifier circuit.

Heretofore, where an AGC voltage is applied to the FM R-F amplifier, the AGC voltage is derived by a separate rectifier circuit connected at some point in the FM signal channel to derive a direct current (D.C.) voltage representative of the average strength of the FM signal. In any event whether the strength of the FM signal from the FM R-F amplifier is controlled by AGC voltages or overload diodes, additional diodes and circuitry therefor is required, thereby increasing the cost and complexity of the transistorized AM/FM receiver.

It is an object of the present invention to provide an improved AM/FM receiver.

It is a further object of this invention to provide an improved AM/FM transistor receiver wherein additional diodes are not required to control the level of signal applied from the FM R-F amplifier to the frequency converter.

A still further object of this invention is to provide an improved AM/FM transistor receiver wherein automatic gain control is provided for both AM and FM operation at minimum cost.

A still further object of this invention is to provide an improved AM/FM receiver having a simple and effective delayed AGC circuit for FM operation.

In a receiver embodying the invention, a transistor amplifier stage, such as an intermediate frequency (I-F) amplifier, is provided for amplifying either AM or FM signals. The amplifier has first and second output circuits tuned respectively to the AM and FM intermediate frequencies. A suitable FM demodulator, such as a ratio detector, is coupled to the output circuit tuned to the FM I-F signal; and an AM demodulator, such as a simple diode detector, is coupled to the AM I-F signal output circuit.

The two output circuits are connected with an impedance element, such as a resistor, which is of small impedance value relative to the impedances of either of the output circuits at their respective center frequencies. The impedance element is coupled to the AM demodulator.

During AM operation, selected signals developed across the I-F output circuit for AM signals are fed to the AM demodulator. The AM demodulator, in addition to deriving audio signals, provides an AGC voltage as a function of the average amplitude of the applied AM signal. This AGC voltage is used to control preceding signal processing stages in the AM signal channel, such as I-F amplifier stages.

During FM operation, signals developed across the I-F output circuit for FM signals are applied to the FM demodulator to derive the desired audio signals. However, a small portion of the FM signal is developed across the impedance element and fed to the AM demodulator. The AM demodulator derives from this signal an AGC voltage representative of the average strength of the selected FM wave. This AGC voltage is applied to the FM R-F amplifier to control the amplitude of the FM wave applied to the frequency converter as discussed above. Furthermore, by proper selection of the impedance value of the impedance element with respect to the biasing of the AM demodulator, the resulting AGC voltage is too small to change the gain of the FM R-F amplifier until the signal level rises substantially to the point at which the transistor I-F amplifier begins to limit. This action provides an effective AGC delay during FM operation.

Thus, the AM demodulator in addition to demodulating applied AM waves, also serves to develop an AGC voltage during AM operation and a delayed AGC voltage during FM operation.

The novel features that are considered to be characteristic of this invention are set forth with particularity in the appended claims. The invention itself however, both as to its organization and method of operation as well as additional objects and advantages thereof will best be understood from the following description when read in connection with the accompanying drawings, the sole figure of which is a schematic circuit diagram of an AM/FM transistor receiver.

The AM/FM receiver includes an FM antenna 10, which is coupled to an R-F amplifier 14. The input circuit 16 of the R-F amplifier 14 comprises a wide band coupling network adjusted to pass signals whose frequencies are in the range extending from 88 to 108 megacycles, which is the frequency band allocated by the FCC for FM signal transmissions. The output circuit 18 of the FM R-F amplifier includes a signal selection circuit tunable by a variable capacitor 20 to a desired frequency in the FM band.

Signals developed across the output circuit 18 are capacity coupled to the emitter of a self-oscillating frequency converter stage 22. The converter stage 22 includes an FM oscillator tank circuit 24 which is tuned by a variable capacitor 26 to the desired FM oscillator frequency which, for example, may be 10.7 megacycles (mc.) above the frequency selected by the output circuit 18. As indicated by the dotted line 19, the variable capacitors 20 and 26 are ganged for unicontrol tuning of the FM oscillator and signal selection circuits. It will be noted that the converter 22 is connected to operate in the common base mode for both the received FM signal and the FM oscillator.

The FM signals fed to the converter stage 22 are heterodyned with the locally generated oscillator signal to produce correspondingly modulated signals at the FM I-F which in the present case have a center frequency of 10.7 mc. The resultant FM I-F wave is developed across the primary winding of a transformer 28, the primary winding being tuned to the frequency of the FM I-F wave.

During AM operation of the receiver, the output circuit 18 of the amplifier 14 is effectively shorted to ground by a switch 30 which is shown in the position for receiving AM waves. It will be noted that the contact arm 30*a* of the switch 30 connects the output circuit to ground through a capacitor 31. A second contact arm 30*b* of the switch 30 connects the AM oscillator tank circuit to, and disconnects the FM oscillator tank circuit from, the frequency converter stage 22. The switch contact arms 30*a* and 30*b* are mechanically coupled for unicontrol operation.

AM signals are intercepted by the AM antenna 32 which is tuned to the desired frequency by a variable tuning capacitor 33, and the selected signals are coupled to the base of the converter stage 22. An AM oscillator tank circuit 34 is tuned by a variable capacitor 36 which is ganged with the variable capacitor 33 in the signal selection circuit. The AM oscillator tank circuit is tuned to a frequency above the selected AM signal by an amount corresponding to the AM intermediate frequency which in the present instance is 455 kc. The converter stage is connected in the common emitter mode for both AM signal and AM oscillator operation.

The AM signals fed to the converter stage 22 are heterodyned with the locally generated oscillator signals to produce correspondingly modulated signals at the AM I-F which in the present instance have a central frequency of 455 kc. The resultant AM I-F wave is developed across the tuned primary winding of a transformer 38.

The secondary windings of the transformers 28 and 38 are tuned respectively to the FM and the AM intermediate frequencies, and are effectively connected in series between the input electrode of the first AM/FM I-F amplifier 40 and a point of reference potential such as ground for the receiver.

The output circuit for the I-F amplifier 40 includes a pair of circuits 42 and 44 effectively connected in series and tuned to the FM and AM intermediate frequencies respectively. The FM output circuit 42 includes the primary winding of an FM I-F coupling transformer 46 whose secondary winding is also tuned to the FM I-F.

The AM I-F output circuit 44 is capacitively tapped down and connected in series with the FM transformer 46 secondary circuit to the input electrode of the second AM/FM I-F amplifier stage 50 for further amplification. The second I-F amplifier 50 includes a pair of series connected output circuits 52 and 54 tuned respectively to the FM and AM intermediate frequencies.

As is known, the AM portion of the various series connected input and output I-F circuits presents very low impedance to signals of the FM I-F. Likewise, the FM portion of these circuits presents very low impedance to signals of the AM I-F.

A suitable FM demodulator circuit such as a ratio detector circuit 56 is coupled to the FM I-F output circuit 52. The ratio detector circuit functions in known manner to derive an audio frequency signal corresponding to the frequency modulation appearing on the FM I-F wave. The demodulated audio frequency signals are fed through a capacitor 58 to a volume controlling resistor 60.

An AM demodulator 62 is coupled to the AM intermediate frequency output circuit 54. The AM demodulator includes a rectifier 64 which is connected to operate as a simple envelope detector to derive an audio signal representative of the amplitude modulation appearing on the AM I-F signal. This audio signal is developed across the volume controlling resistor 60. Audio signals appearing on the resistor 60 are fed through the capacitor 66 to an audio frequency amplifier 68 which may comprise one or more audio amplifying stages for driving a sound reproducing loudspeaker 70.

The I-F output circuits 52 and 54 are connected in series with an impedance element which is shown in the drawings as a resistor 72. The resistor 72 has a resistance which is small relative to the impedance of either of the intermediate frequency output circuits 52 and 54 at their respective center frequencies. One side of the impedance element 72 is coupled to the anode of the diode 64 through a coupling capacitor 74 and the secondary winding 75 of the AM I-F coupling transformer. The other side of the resistor 72 is A.-C. coupled to the cathode of the diode 64 through a ground and the capacitors 76 and 78.

For the reception of AM signals, the switch 30 including the sections 30*a* and 30*b* is thrown to the position shown in the drawings. Thus, the output of the FM R-F amplifier 14 is effectively shorted to ground, the FM oscillator tank circuit is disconnected from the converter stage 22, and the AM oscillator tank circuit 34 is connected in the frequency converter circuit. Received AM signals applied to the frequency converter 22 are heterodyned thereby to a corresponding intermediate frequency signal, and are coupled through the transformer 38 to the first I-F amplifier 40. The AM I-F signal is amplified and developed across the AM output circuit 44 for application to the second I-F amplifier 50 where the signals are amplified further and developed across the AM I-F amplifier output circuit 54. As mentioned above, the various FM I-F input and output circuits provide very low impedances to signals at the AM intermediate frequency, and accordingly have substantially no effect on the AM operation of the receiver. AM signals appearing across the AM output circuit 54 are detected in the AM demodulator circuit 62 and are developed across the volume controlling resistor 60 for application to the audio amplifier 68 and loudspeaker 70.

The voltage appearing at the cathode of the AM detector diode 64 is filtered by a series resistor 80 and shunt capacitor 82 to derive a direct voltage at the AGC terminal 81 whose amplitude is a function of the average amplitude of the received AM carrier wave. This voltage is applied to the base electrode of the first I-F amplifier 40, and to control the gain thereof as an inverse function of the received signal level to maintain the audio signal output of the AM demodulator substantially constant.

Since the resistor 72 has very low resistance relative to that of the AM I-F output circuit 54, the coupling to the AM detector from the output circuit 54 is predominant and the resistor 72 has substantially no effect during AM operation.

It will be noted that the AGC control applied from the terminal 81 is amplified by the I-F amplifier 40 and appears across an emitter resistor 83. The amplified AGC voltage is filtered by a series resistor 84 and shunt capacitor 86 and applied to the base electrode of the FM R-F amplifier 14. As mentioned above, the FM R-F amplifier 14 output is shorted out during AM operation.

During FM operation the switch 30 including the contact sections 30*a* and 30*b* is moved to its alternative position. In this position, the signal output of the FM R-F amplifier is applied to the frequency converter 22, and the FM oscillator tank circuit is connected with the collector electrode of the converter stage 22. Thus, received FM signals selected by the FM signal selection circuit 18 are applied to the frequency converter 22 and heterodyned to a corresponding signal at the FM intermediate frequency.

These signals are coupled through the output transformer 28 to the first I-F amplifier 40 for amplification. The amplified FM I-F signals are developed across the output circuit 42 and coupled to the second I-F amplifier stage 50 for further amplification, the amplified signal being developed across the FM I-F output circuit 52.

The resultant FM I-F signal is applied to the FM demodulator or ratio detector circuit 56 to derive an audio signal corresponding to the frequency modulation thereof. The resultant audio frequency signal is applied by way of the volume controlling circuit 60 to the audio amplifier 68 and loudspeaker 70.

As previously pointed out, it is desirable to control the amplitude of the FM applied to the converter stage 22 to prevent pulling of the FM oscillator toward the frequency of the applied signal. To this end an automatic gain control voltage is derived to control the gain of the R-F amplifier 14 in accordance with the level of a received FM signal.

Since the impedance of the AM I-F output circuit 54 is very low at the frequency of the FM I-F wave, there is substantially no coupling of the FM I-F wave to the AM detector circuit by way of the AM output circuit 54. However, a small portion of the FM I-F wave is developed across the resistor 72, and applied by way of the capacitors 74, 76 and 78 across the AM detector diode 64. This portion of the FM I-F wave is rectified to derive at the AGC terminal 81, a D.C. voltage whose amplitude is a function of the average level of the applied FM I-F wave. The AGC voltage appearing at the terminal 81 is amplified by the I-F amplifier 40, and applied to the FM R-F amplifier 14 to control the gain thereof, and hence the amplitude of the signal applied to the frequency converter stage 22.

The AGC voltage applied to the R-F amplifier is delayed so that very little AGC voltage is developed until the signal rises to a level sufficiently high that limiting action starts in the second I-F amplifier 50. It is desirable to delay the AGC voltage to permit the signal level at the second I-F amplifier 50 to be large enough to begin limiting and thereby remove undesirable amplitude modulation components from the FM wave.

To understand how the delayed AGC for FM operation is effected, it will be noted that a slight forward bias voltage is applied to the diode 64 by the volume controlling resistor 60 which forms a part of voltage divider comprising the resistors 60, 80 and 87 that is connected across the receiver battery 85. How much signal voltage must be present across the resistor 72 before any substantial amount of AGC voltage is developed is determined by the curvature of the diode 64 current-voltage characteristic. Under representative conditions, the forward bias on the diode may be 50 millivolts (mv.). At this point about 50 millivolts of signal is required across the resistor before appreciable AGC voltage is developed.

The resistor 72 is selected to be of a resistance value which will produce the desired voltage, i.e. 50 mv., at the time the I-F amplifier 50 starts limiting. As the signal level increases further from this point the AGC voltage developed at the terminal 81 will also increase until full limiting is reached. It will be recognized that the particular forward bias on the diode 64, if any, and the amount of voltage required from the resistor 72 before an AGC voltage is developed, is not limited to the foregoing example, and may be varied to meet the exigencies of a particular AM/FM receiver design.

Furthermore this invention is not restricted to the particular receiver layout described. For example, additional amplifier stage or stages may be added for the FM wave only, with the AM detector and AM and FM AGC developing circuit 62 coupled to a preceding stage. Such a receiver design would have the advantage of permitting the succeeding stages to go into limiting earlier than the the stage from which the AGC voltage is derived, thereby further improving the amplitude modulation rejection characteristic of the receiver with respect to the FM I-F wave.

It will be seen that the AM demodulator serves three functions: to demodulate the AM intermediate frequency wave during AM reception; to provide a D.C. voltage representative of the average amplitude of the AM intermediate frequency wave during AM reception; and to provide a delayed D.C. voltage representative of the average amplitude of the FM intermediate frequency wave during FM reception. The sensitivity of the system is not degraded by the presence of the resistor 72 because its resistance value is small with respect to that of the AM or FM output circuits 54 or 52 at their center frequencies respectively. Representative values would be a resistance on the order of 300 ohms for the resistor 72, and impedances of about 4,000 ohms each for the respective output circuits 52 and 54.

What is claimed is:

1. In an amplitude modulation-frequency modulation receiver of the type including a radio frequency amplifier for received frequency modulation signals, a frequency converter selectively operable to convert a received frequency modulation wave translated by said radio frequency amplifier to a corresponding wave of a first intermediate frequency or for converting a received amplitude modulation wave to a corresponding wave of a second intermediate frequency, the combination comprising an intermediate frequency amplifier having first and second output circuits tuned respectively to the first and second intermediate frequencies, an impedance element, means connecting said first and second output circuits in series with said impedance element, an amplitude modulation demodulator coupled to the output circuit for said second intermediate frequency wave, means coupled to said amplitude modulation demodulator for deriving an automatic gain control voltage, means coupling said impedance element to said amplitude modulation demodulator whereby an automatic gain control voltage is developed thereby during the reception of frequency modulation waves, and means for applying said automatic gain control voltages to control the gain of said radio frequency amplifier.

2. A receiver of the type defined in claim 1 wherein the impedance of said impedance element is small relative to the impedance of said first and second output circuits at their respective frequencies of resonance.

3. In an amplitude modulation-frequency modulation receiver of the type including a radio frequency amplifier for received frequency modulation signals; a self-oscillating frequency converter circuit including a transistor, means selectively connecting said transistor frequency converter to convert a received frequency modulation wave translated by said radio frequency amplifier to a corresponding wave of a first intermediate frequency or for converting a received amplitude modulation wave to a corresponding wave of a second intermediate frequency, said transistor frequency converter subject to undesirable pulling of the oscillator frequency thereof in the presence of strong frequency modulation signals: the combination comprising an intermediate frequency amplifier having first and second output circuits tuned respectively to said first and second intermediate frequencies; an impedance element the impedance of which is small relative to that of said first and second output circuits at their respective tuned frequencies; means connecting said first and second output circuits in series with said impedance element; an amplitude modulation demodulator coupled to the output circuit for said second intermediate frequency wave; means coupled to said amplitude modulation demodulator for deriving an automatic gain control voltage as a function of the average signal level applied thereto; means for applying frequency modulation signals developed across said impedance element to said amplitude modulation demodulator so that an automatic gain control voltage is developed thereby during the reception of frequency modulation waves; and means for applying said automatic gain control voltages to said radio frequency amplifier to limit the amplitude of frequency modulation waves applied to said transistor frequency converter.

4. In an amplitude modulation-frequency modulation receiver of the type including an intermediate frequency amplifier having a first output circuit tuned to the frequency of frequency modulation intermediate frequency waves, frequency modulation detector means coupled to said first output circuit for deriving audio frequency signals from said frequency modulation intermediate frequency waves, a second output circuit tuned to the frequency of amplitude modulation intermediate frequency waves, amplitude modulation detector means coupled to said second output circuit for deriving audio frequency signals from said amplitude modulation intermediate frequency waves, the combination comprising a resistor whose resistance value is small relative to the impedances of said first and second output circuits at their respective resonant frequencies, means connecting said resistor in series with said first and second output circuits, means coupling said resistor to apply signals developed thereacross to said amplitude modulation detector, means coupled to said amplitude modulation detector for deriving a direct voltage during frequency modulation operation of said receiver whose amplitude is a function of the level of a selected frequency modulation signal.

5. In an amplitude modulation-frequency modulation receiver of the type including a radio frequency amplifier for received frequency modulation signals, a self-oscillating frequency converter selectively operable to convert a received frequency modulation wave translated by said radio frequency amplifier to a corresponding wave of a first intermediate frequency or for converting a received amplitude modulation wave to a corresponding wave of a second intermediate frequency, the combination comprising an intermediate frequency amplifier having first and second output circuits tuned respectively to said first and second intermediate frequencies, said amplifier operable to begin limiting of signals applied thereto above a predetermined first level, an impedance element, means connecting said said first and second output circuits in series with said impedance element, an amplitude modulation demodulator including a diode coupled to the output circuit for said second intermediate frequency wave, said diode operable to provide a direct output voltage for signals applied thereto above a predetermined second level, the impedance of said impedance element being small relative to that of said first and second output circuits at their respective tuned frequencies but large enough to cause a voltage of said second predetermined level to be developed thereacross when signals of said first predetermined level are applied to said intermediate frequency amplifier, means coupled to said amplitude modulation demodulator for deriving an automatic gain control voltage, means coupling said impedance element to said amplitude modulation demodulator whereby a delayed automatic gain control voltage is developed thereby during the reception of frequency modulation waves, and means for applying said automatic gain control voltages to said radio frequency amplifier.

6. In an amplitude modulation-frequency modulation receiver of the type including an intermediate frequency amplifier having an output electrode coupled to a first output circuit tuned to the frequency of frequency modulation intermediate frequency waves, frequency modulation detector means coupled to said first output circuit for deriving audio frequency signals from said frequency modulation intermediate frequency waves, a second output circuit coupled to said output electrode tuned to the frequency of amplitude modulation intermediate frequency waves, amplitude modulation detector means including a diode coupled to said second output circuit for deriving audio frequency signals from said amplitude modulation intermediate frequency waves, the combination comprising a resistor whose resistance value is small relative to the impedances of said first and second output circuit at their respective resonant frequencies, means connecting said first and second output circuit and said resistor in series in the order named between said output electrode and a point of reference potential for said receiver, a frequency modulation coupling capacitor connected between the junction of said second circuit and said resistor to one terminal of said diode to apply frequency modulation signals developed across said resistor to said diode, filter means coupled to said amplitude modulation detector for deriving a direct voltage during frequency modulation operation of said receiver whose amplitude is a function of the level of a received frequency modulation signal.

7. In an amplitude modulation-frequency modulation receiver of the type incorporating transistors as the active circuit elements thereof and including a transistor intermediate frequency amplifier having a first output circuit tuned to the frequency of frequency modulation intermediate frequency waves, frequency modulation detector means coupled to said first output circuit for deriving audio frequency signals from said frequency modulation intermediate frequency waves, a second output circuit including the primary winding of a coupling transformer tuned to the frequency of amplitude modulation intermediate frequency waves, amplitude modulation detector means including a diode connected to the secondary winding of said coupling transformer for deriving audio frequency signals from said amplitude modulation intermediate frequency waves, the combination comprising a resistor whose resistance value is small relative to the impedances of said first and second output circuit at their respective resonant frequencies, means connecting said first and second output circuits and said resistor in series in the order named between the output electrode of said intermediate frequency amplifier and a point of reference potential for said receiver, a frequency modulation coupling capacitor connected between the junction of said resistor and said second output circuit and one terminal of said diode, capacitive coupling means connecting the remaining terminal of said resistor to the remaining terminal of said diode to apply frequency modulation signals developed across said resistor to said diode, filter means coupled to said amplitude modulation detector for deriving an automatic gain control voltage during frequency modulation operation of said receiver whose amplitude is a function of the level of a received frequency modulation signal.

8. A receiver as defined in claim 7 wherein said intermediate frequency amplifier is operable to begin limiting when signals of a first level are applied thereto, and said amplitude modulation detector is operable to produce a direct output voltage in response to signals of a second level, said resistor being of a value to have signals of said second level developed thereacross when signals of said first level are applied to said intermediate frequency amplifier, whereby said automatic gain control voltage is delayed until said intermediate frequency amplifier begins limiting.

9. In an amplitude modulation-frequency modulation receiver of the type including a radio frequency amplifier for received frequency modulation signals, a frequency converter selectively operable to convert a received frequency modulation wave translated by said radio frequency amplifier to a corresponding wave of a first intermediate frequency or for converting a received amplitude modulation wave to a corresponding wave of a second intermediate frequency, the combination comprising an intermediate frequency amplifier having first and second output circuits tuned respectively to the first and second intermediate frequencies, an impedance element coupled to said first output circuit, an amplitude modulation demodulator coupled to the output circuit for said second intermediate frequency wave, means coupled to said amplitude modulation demodulator for deriving an automatic gain control voltage, means coupling said impedance element to said amplitude modulation demodulator whereby an automatic gain control voltage is developed thereby during the reception of frequency modulation waves, and means for applying said automatic gain control voltages to said radio frequency amplifier.

10. In an amplitude modulation-frequency modulation receiver of the type including a radio frequency amplifier for received frequency modulation signals, a frequency converter selectively operable to convert a received frequency modulation wave translated by said radio frequency amplifier to a corresponding wave of a first intermediate frequency or for converting a received amplitude modulation wave to a corresponding wave of a second intermediate frequency, the combination comprising, an intermediate frequency amplifier for said intermediate frequency waves having an output circuit comprising a first tuned circuit tuned to the first intermediate frequency, a second tuned circuit tuned to the second intermediate frequency, and an impedance element, the said tuned circuits and said impedance element being connected in a series circuit, an amplitude modulation demodulator inductively coupled to said second tuned circuit and capacitively coupled across said impedance element whereby a demodulated amplitude modulation signal and an automatic gain control voltage are developed by said demodulator during reception of amplitude modulated waves and an automatic gain control voltage is developed by said demodulator during reception of frequency modulated waves, and means for connecting said demodulator to apply said automatic gain control voltages to control the gain of said receiver.

References Cited in the file of this patent

UNITED STATES PATENTS

| | | |
|---|---|---|
| 2,709,748 | Goldsmith | May 31, 1955 |
| 2,773,178 | Abbe et al. | Dec. 4, 1956 |

FOREIGN PATENTS

| | | |
|---|---|---|
| 448,851 | Canada | June 1, 1948 |

OTHER REFERENCES

RCA Service Data Bulletin, Model 2–xF–91, 1952, No. 16, pub. Dec. 16, 1952, 6 pp.